United States Patent
Miyazawa

(10) Patent No.: US 9,496,482 B2
(45) Date of Patent: Nov. 15, 2016

(54) ACTUATOR, ROBOT HAND, ROBOT, ELECTRIC COMPONENT CONVEYING APPARATUS, ELECTRONIC COMPONENT TESTING APPARATUS, AND PRINTER

(71) Applicant: Seiko Epson Corporation, Tokyo (JP)

(72) Inventor: Osamu Miyazawa, Shimosuwa (JP)

(73) Assignee: Seiko Epson Corporation (JP)

( * ) Notice: Subject to any disclaimer, the term of this patent is extended or adjusted under 35 U.S.C. 154(b) by 742 days.

(21) Appl. No.: 13/692,465

(22) Filed: Dec. 3, 2012

(65) Prior Publication Data

US 2013/0140953 A1    Jun. 6, 2013

(30) Foreign Application Priority Data

Dec. 6, 2011    (JP) ................. 2011-266550

(51) Int. Cl.
| | | |
|---|---|---|
| *H01L 41/09* | (2006.01) | |
| *H01L 41/053* | (2006.01) | |
| *H02N 2/08* | (2006.01) | |
| *B25J 15/00* | (2006.01) | |
| *H02N 2/00* | (2006.01) | |
| *H02N 2/10* | (2006.01) | |
| *H02N 2/02* | (2006.01) | |
| *H02N 2/12* | (2006.01) | |

(52) U.S. Cl.
CPC ........ *H01L 41/0906* (2013.01); *B25J 15/0009* (2013.01); *H01L 41/053* (2013.01); *H01L 41/0913* (2013.01); *H01L 41/0926* (2013.01); *H02N 2/0055* (2013.01); *H02N 2/103* (2013.01); *H02N 2/028* (2013.01); *H02N 2/126* (2013.01); *Y10S 901/32* (2013.01)

(58) Field of Classification Search
CPC ............ H01L 41/053; H01L 41/0926; H02N 2/0015; H02N 2/004; H02N 2/006; H02N 2/026; H02N 2/103; H02N 2/108
USPC ............ 310/330, 348, 323.01-2, 323.16-17, 310/328
IPC ......... B25J 15/02; H01L 41/053, 41/09; H02N 2/026, 2/103
See application file for complete search history.

(56) References Cited

U.S. PATENT DOCUMENTS

| | | | |
|---|---|---|---|
| 5,136,200 A * | 8/1992 | Takizawa ............... | H02N 2/003 310/323.16 |
| 5,453,653 A | 9/1995 | Zumeris | |
| 5,616,980 A | 4/1997 | Zumeris | |
| 5,682,076 A | 10/1997 | Zumeris | |
| 5,714,833 A * | 2/1998 | Zumeris ............... | G11B 5/5552 310/328 |
| 5,777,423 A | 7/1998 | Zumeris | |

(Continued)

FOREIGN PATENT DOCUMENTS

| | | |
|---|---|---|
| JP | 07-002336 A | 1/1995 |
| JP | 2003-259670 A | 9/2003 |

(Continued)

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

An actuator includes a vibrating piezoelectric element and a holding section configured to hold the piezoelectric element. The holding section includes a first supporting section arranged on a vibrating surface of the piezoelectric element and arranged on one side of the piezoelectric element and a second supporting section arranged on the other side of the piezoelectric element.

4 Claims, 8 Drawing Sheets

(56) References Cited

U.S. PATENT DOCUMENTS

| | | |
|---|---|---|
| 5,877,579 A | 3/1999 | Zumeris |
| 6,064,140 A | 5/2000 | Zumeris |
| 6,211,603 B1 | 4/2001 | Iino et al. |
| 6,455,983 B2 | 9/2002 | Dettmann et al. |
| 6,897,598 B2 * | 5/2005 | Kato .................. H01L 41/0913 310/317 |
| 7,633,207 B2 | 12/2009 | Sakamoto |
| 7,663,292 B2 | 2/2010 | Adachi |
| 8,018,123 B2 | 9/2011 | Mukae |

FOREIGN PATENT DOCUMENTS

| | | | | |
|---|---|---|---|---|
| JP | 2004-236445 | | 8/2004 | |
| JP | 2007-189900 | | 7/2007 | |
| JP | WO2007008851 | * | 7/2007 | ............... H02N 2/00 |
| JP | WO2007080851 | * | 7/2007 | |
| JP | WO 2007080851 | * | 7/2007 | |
| JP | 2009-017778 A | | 1/2009 | |
| WO | 2007/080851 | | 7/2007 | |
| WO | 2008/093799 | | 8/2008 | |

* cited by examiner

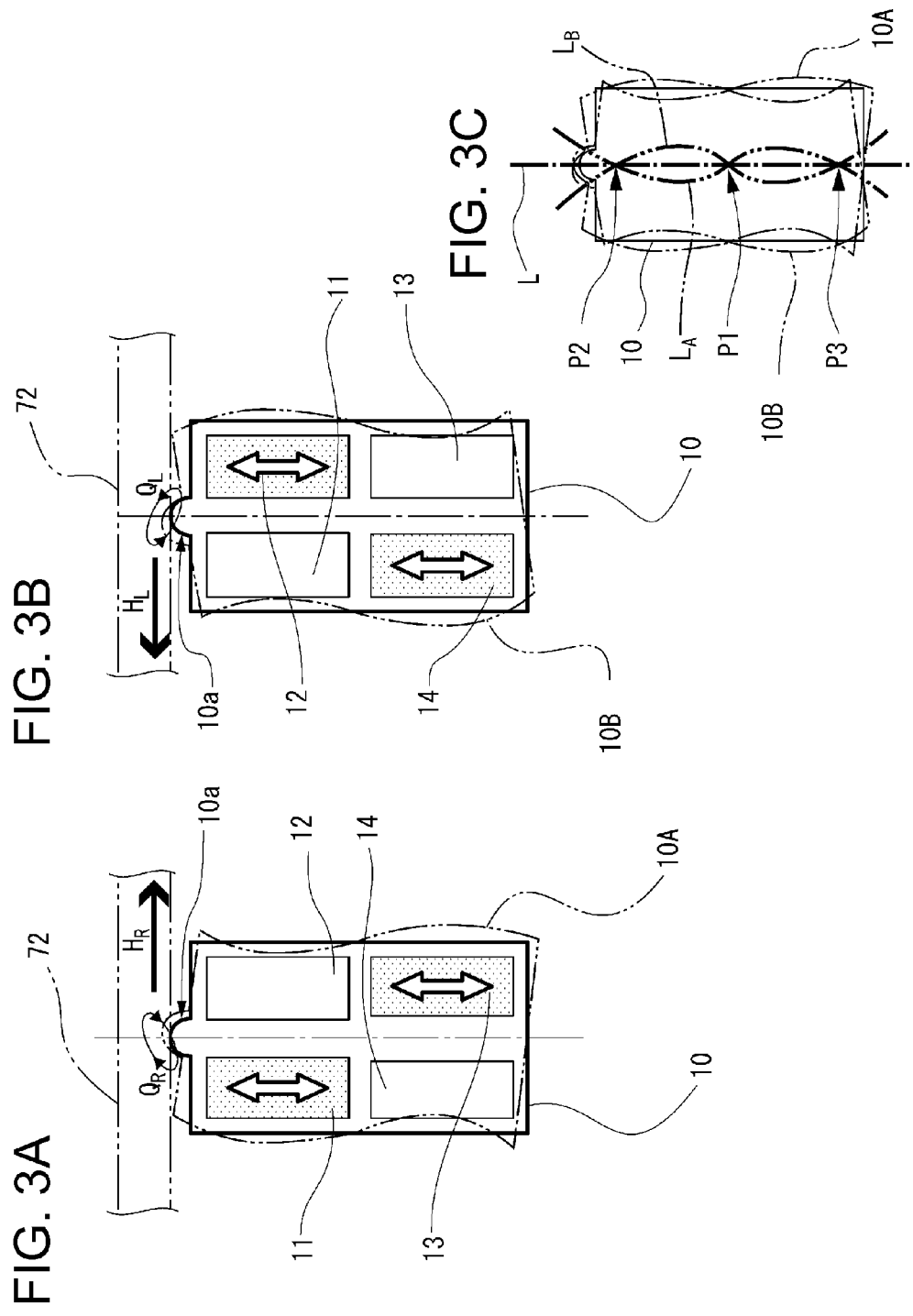

ACTUATOR, ROBOT HAND, ROBOT, ELECTRIC COMPONENT CONVEYING APPARATUS, ELECTRONIC COMPONENT TESTING APPARATUS, AND PRINTER

BACKGROUND

1. Technical Field

The present invention relates to an actuator, a robot hand, a robot, an electronic component conveying apparatus, an electronic component testing apparatus, and a printer.

2. Related Art

As a driving method for an actuator in the past, there is known a method of exciting a piezoelectric body in two vibration modes, moving a protrusion section provided at an end of the piezoelectric body on an elliptical track, and driving a driven body, which comes into contact with the protrusion section, in a predetermined direction. In the actuator, in order to urge the piezoelectric body to the driven body, a side surface side of a vibrating surface of the piezoelectric body is pressed against and held in a holding case via an elastic member and the holding case is urged in the direction of the driven body by urging means, whereby the piezoelectric body is urged to the driven body (WO2007/80851 (Patent Literature 1) and WO2008/93799 (Patent Literature 2)). Further, JP-A-2007-189900 (Patent Literature 3) discloses a configuration for holding a part of an outer edge portion of a piezoelectric body, urging a holding case for holding the piezoelectric body to a driven body, and urging the piezoelectric body to the driven body.

However, in Patent Literatures 1 and 2, the elastic member for holding the piezoelectric body is arranged to limit a vibrating direction of the piezoelectric body, in particular, vibration with respect to bending vibration. Therefore, it is likely that the vibration of the piezoelectric body leaks to the holding case through the elastic member and a lot of driving energy for the driven body is lost. In Patent Literature 3, it is likely that a vibration leak from a guiding section of the holding case for holding the piezoelectric body occurs and a lot of driving energy for the driven body is lost.

SUMMARY

An advantage of some aspects of the invention is to provide an actuator that suppresses a vibration leak of the vibration of a piezoelectric body to a holding case while holding the piezoelectric body in the holding case and surely converts the vibration of the piezoelectric body into driving force for a driven body.

An aspect of the invention can be implemented as the following forms or application examples.

Application Example 1

This application example is directed to an actuator including: a piezoelectric element excited to vibrate in a longitudinal vibration mode and a bending vibration mode; a driven body with which a contact section included in the piezoelectric element comes into contact, the driven body being driven by the vibration of the contact section; a holding section configured to hold the piezoelectric element; and a base including an urging section configured to urge the holding section to the driven body. The holding section includes a first supporting section arranged in a direction crossing a vibrating surface of the piezoelectric element and arranged on one side of the piezoelectric element and a second supporting section arranged on the other side to be opposed to the first supporting section via the piezoelectric element.

The actuator according to this application example includes the first supporting section and the second supporting section to apply force to the vibrating surface including a vibrating direction of the piezoelectric element from the direction crossing the vibrating surface and hold the piezoelectric element. Therefore, since the vibration is not restrained, it is possible to suppress the vibration of the piezoelectric element from leaking to the holding section and obtain highly efficient driving. Consequently, it is possible to generate a swing of the contact section without wasting the vibration of the piezoelectric element and convert the swing into the rotation or the linear motion of the driven body that comes into contact with the contact section. In other words, it is possible to obtain an actuator having high driving efficiency.

Application Example 2

This application example is directed to the actuator of the application example described above, wherein a supported region of the piezoelectric element supported by the first supporting section and the second supporting section includes at least one of nodes of vibration, which are nodes of vibration in the longitudinal vibration mode of the piezoelectric element and nodes of vibration in the bending vibration mode of the piezoelectric element.

According to this application example, the first supporting section and the second supporting section are provided in the region including the nodes of the vibration of the piezoelectric element. Since the region is a region with a small moving amount due to the vibration on the vibrating surface of the piezoelectric element, i.e., a region with small amplitude, it is possible to further suppress the vibration leak to the holding section.

Application Example 3

This application example is directed to the actuator of the application example described above, wherein at least one of the first supporting section and the second supporting section includes a cushioning member.

According to this application example, the actuator includes the first supporting section and the second supporting section including the cushioning member to hold the piezoelectric element in the direction crossing the vibrating surface. Therefore, it is possible to suppress the vibration of the piezoelectric element from leaking to the holding section. Consequently, it is possible to generate a swing of the contact section without wasting the vibration of the piezoelectric element and convert the swing into the rotation or the linear motion of the driven body that comes into contact with the contact section. In other words, it is possible to obtain an actuator having high driving efficiency. The cushioning member allows the vibration in the vibrating surface direction as vibration displacement. Therefore, it is possible to maintain vibration necessary for the driving of the driven body. Further, the vibration displacement is distributed in the region including the nodes. However, it is possible to maintain the vibration necessary for the driving of the driven body by allowing the vibration displacement. In other words, it is possible to obtain an actuator having high driving efficiency.

Application Example 4

This application example is directed to the actuator of the application example described above, wherein at least one of the first supporting section and the second supporting section includes an elastic member.

According to this application example, the elastic member is arranged in at least one of the first supporting section and the second supporting section. Therefore, it is possible to suppress, with a friction force between the holding member and the piezoelectric element against an elastic force of the elastic member, relative positional deviation between the holding member and the piezoelectric element due to vibration.

Application Example 5

This application example is directed to a robot hand including the actuator according to the application example described above.

Even if the robot hand according to this application example includes a large number of motors to increase a degree of freedom of actions, the robot hand can be reduced in size and weight compared with an electromagnetic motor.

Application Example 6

This application example is directed to a robot including the actuator or the robot hand according to the application example described above.

The robot according to this application example is driven by the actuator that has fine driving resolution and vibrates at high speed. Therefore, it is possible to accurately hold a work object and convey the work object to a target position accurately and at high speed, enable a reduction in an operation time of the robot, and realize high productivity. Further, it is possible to enable, for example, assembly work of a complicated electronic apparatus.

Application Example 7

This application example is directed to an electronic component conveying apparatus including the actuator according to the application example described above.

The electronic component conveying apparatus according to this application example has fine driving resolution and vibrates at high speed. Therefore, it is possible to convey an electronic component or the like to an accurate position at high speed, enable a reduction in a test time and an assembly time of the electronic component, and enable, for example, assembly work of a complicated electronic apparatus.

Application Example 8

This application example is directed to an electronic component testing apparatus including the actuator or the electronic component conveying apparatus according to the application example described above.

The electronic component testing apparatus according to this application example includes the actuator or the electronic component conveying apparatus that has fine driving resolution and vibrates at high speed. Therefore, it is possible to convey a test target electronic component or the like to an accurate position at high speed and enable a reduction in a test time and an assembly time of the electronic component.

Application Example 9

This application example is directed to a printer including the actuator according to the application example described above.

The printer according to this application example includes, in a driving device region, the actuator that has fine driving resolution and vibrates at high speed. Therefore, it is possible to accurately move a driving object to a target position at high speed, enable a reduction in an operation time of the printer, and realize high productivity. Further, since the printer can be driven at high speed, it is possible to smoothly perform driving of a cutter driven to linearly move a long distance to cut a printing medium.

BRIEF DESCRIPTION OF THE DRAWINGS

The invention will be described with reference to the accompanying drawings, wherein like numbers reference like elements.

FIGS. 3A to 3C are explanatory diagrams of a vibrating action of the piezoelectric element according to the first embodiment.

DESCRIPTION OF EXEMPLARY EMBODIMENTS

Embodiments of the invention are explained below with reference to the accompanying drawings.

First Embodiment

Figures 1A, 1B, 1C:
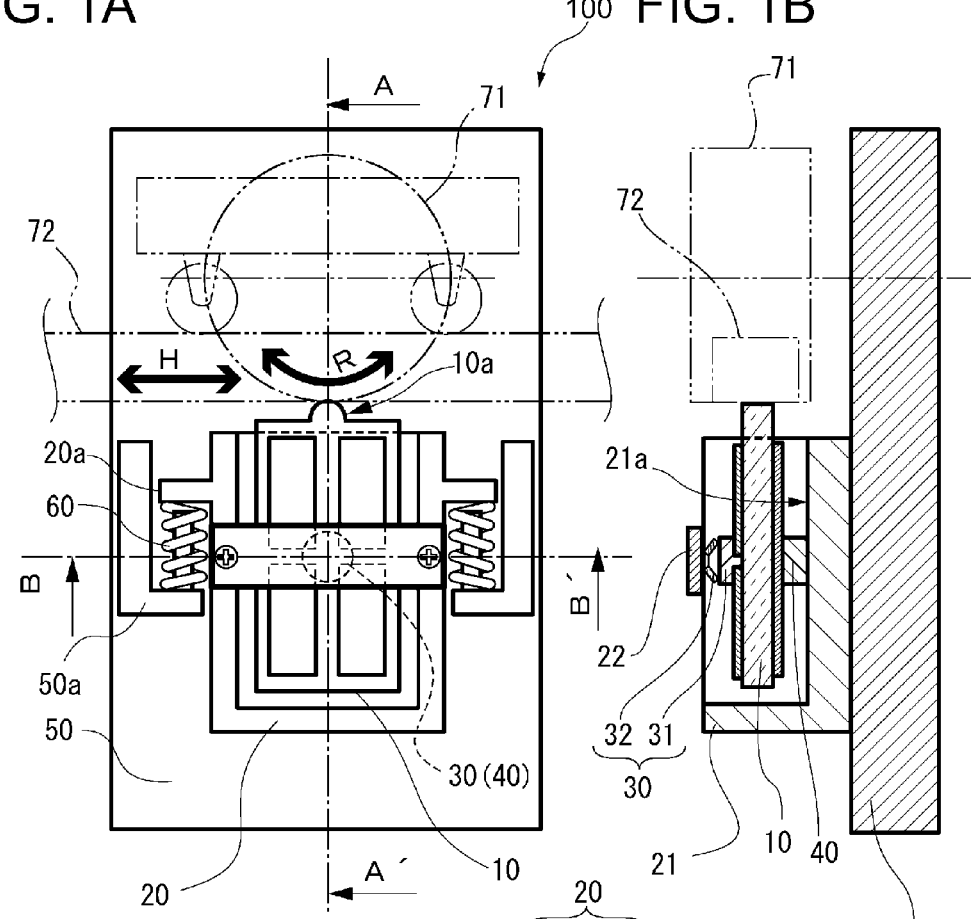
FIG. 1A is a plan view of an actuator according to a first embodiment.
FIG. 1B is a sectional view of an A-A' section shown in FIG. 1A.
FIG. 1C is a sectional view of a B-B' section shown in FIG. 1A.

FIGS. 1A to 1C show an actuator according to a first embodiment. FIG. 1A is a plan view, FIG. 1B is a sectional view of an A-A' section shown in FIG. 1A, and FIG. 1C is a sectional view of a B-B' section shown in FIG. 1A. As shown in FIG. 1A, an actuator 100 includes a holding case 20 functioning as a holding member, a piezoelectric element 10 held in the holding case 20, a base 50 including a spring fixing section 50a to which springs 60 functioning as urging means for the holding case 20 are attached, and a driven body 71 or a driven body 72.

The driven body 71 is driven to rotate in an R direction shown in the figure. The driven body 72 is linearly driven in an H direction shown in the figure. In the explanation of the actuator 100 according to this embodiment, the linear driving in the H direction of the driven body 72 is explained. However, the driven body 71 driven to rotate may be provided in the actuator 100. An urging section 20a of the holding case 20 is urged to the spring fixing section 50a included in the base 50 by the springs 60. The piezoelectric element 10 is urged to the driven body 72 via the urged holding case 20. A protrusion section 10a including a contact section, which comes into contact with the driven body 72, is provided in the piezoelectric element 10. As explained in detail below, the protrusion section 10a swings while drawing an elliptical track according to the vibration of the piezoelectric element 10. The driven body 72 is linearly driven in the H direction by this elliptical motion.

As shown in FIGS. 1B and 1C, the holding case 20 includes a case body 21 and a pressing plate 22 fixed to the case body 21 by screws 23. The holding case 20 holds the piezoelectric element 10 between a supporting surface 21a of the case body 21 and the pressing plate 22 via a first supporting section 30 and a second supporting section 40. The first supporting section 30 is arranged between the pressing plate 22 and the piezoelectric element 10. The first supporting section 30 includes a cushioning member 31 functioning as a cushioning section, which comes into contact with the piezoelectric element 10, and a disc spring 32 functioning as an elastic section arranged between the cushioning member 31 and the pressing plate 22. The second supporting section 40 is arranged between the supporting surface 21a of the case body 21 and the piezoelectric element 10 using a cushioning material. The piezoelectric element 10 is held between the pressing plate 22 and the supporting surface 21a of the case body 21 with a spring force of the disc spring 32 of the first supporting section 30 and held and fixed in the holding case 20 by the first supporting section 30, the piezoelectric element 10, and the second supporting section 40 arranged as explained above.

As the cushioning material forming the cushioning member 31 and the second supporting section 40, a material having performance for preventing vibration excited in the piezoelectric element 10 from leaking to the holding case 20 side is used. The performance is represented by dynamic viscoelasticity (tan δ). In the actuator 100 according to this embodiment, tan δ is desirably equal to or smaller than 0.05. When sine wave distortion ε is given to the material in a tensile mode, in generation of stress σ in the material, a delay phase δ occurs with respect to the given distortion. The dynamic viscoelasticity (tan δ) is obtained by quantizing the dynamic viscosity of the material using the phase δ. When the dynamic viscoelasticity is large, i.e., the phase δ is large, a transfer delay of the given distortion occurs on the inside of the material. In other words, it is possible to reduce the speed of the transfer of vibration and suppress a vibration leak to the holding case 20. As the cushioning material forming the cushioning member 31 and the second supporting section 40, for example, rubber, elastomer, or polyimide is suitably used. However, since heat tends to be generated by the driving of the actuator 100, polyimide excellent in heat resistance can be suitably used. Even when the cushioning material has only elasticity, there is an effect of reducing vibration displacement. Therefore, there is an effect of suppressing vibration transmitted to the protection case.

Figures 2A, 2B, 2C:
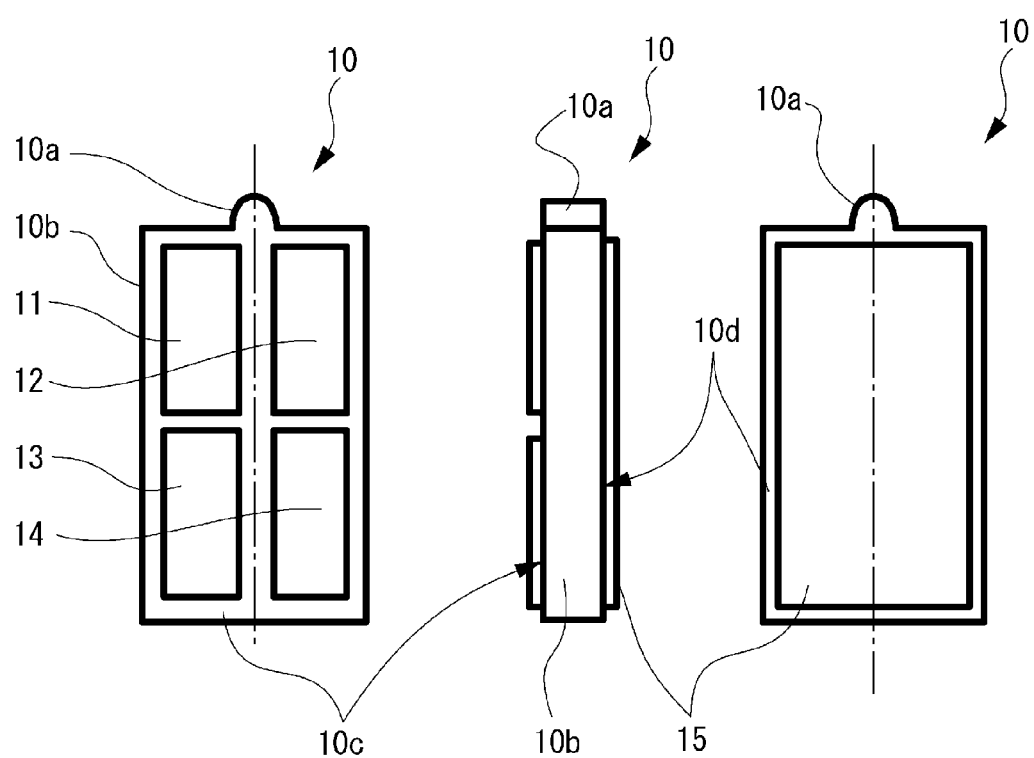
FIG. 2A is a front plan view showing an electrode arrangement of a piezoelectric element according to the first embodiment.
FIG. 2B is a side view showing the electrode arrangement.
FIG. 2C is a rear plan view showing the electrode arrangement.

FIGS. 2A to 2C show a form of the piezoelectric element 10. FIG. 2A is a front plan view, FIG. 2B is a side view, and FIG. 2C is a rear plan view. As shown in FIG. 2A, in the piezoelectric element 10, electrodes 11, 12, 13, and 14 that excite bending vibration are formed on one surface 10c of a piezoelectric body 10b. Further, a common electrode 15 is formed on the other surface 10d. As the material of the piezoelectric body 10b, any material having piezoelectricity can be used. However, PZT (lead zirconate titanate) is suitably used. As the material of the electrodes, any conductive metal can be used. However, the electrodes are formed by a method such as a sputtering method or an evaporation method using, for example, Al, Au, Ag, W, or Cu. The protrusion section 10a comes into contact with the driven body 72 and drives the driven body 72 with friction of the contact. Therefore, the protrusion section 10a is formed of a material having a high coefficient of friction with the driven body 72 and excellent in abrasion resistance and fixed by a not-shown method. Alternatively, the material having a high coefficient of friction with the driven body 72 and excellent in abrasion resistance is coated on the surface of the protrusion section 10a formed integrally with the piezoelectric body 10b. As the material excellent in abrasion resistance used in the protrusion section 10a, ceramics such as alumina is suitably used.

FIGS. 3A to 3C are plan views for schematically explaining the operation of the piezoelectric element 10. As shown in FIG. 3A, charges are applied between the electrodes 11 and 13 and the common electrode 15 shown in FIGS. 2A to 2C and charges are not applied to the electrodes 12 and 14, whereby longitudinal vibration indicated by arrows shown in the figures is excited in regions corresponding to the electrodes 11 and 13 in the piezoelectric element 10. However, since charges are not applied to the electrodes 12 and 14, longitudinal vibration is not excited in the electrodes 12 and 14. As a result, bending vibration is caused in the piezoelectric element 10 by the longitudinal vibration of the electrodes 11 and 13 and the non-vibration of the electrodes 12 and 14. The piezoelectric element 10 vibrates as indicated by a piezoelectric element 10A. The longitudinal vibration and the bending vibration by the longitudinal vibration occur in the piezoelectric element 10. The protrusion section 10a swings in an arrow direction of an elliptical track $Q_R$ shown in the figure. The swing in the $Q_R$ direction on the elliptical track of the protrusion section 10a drives the driven body 72, which is brought into contact with the protrusion section 10a, as indicated by $H_R$ shown in the figure.

In the operation of the piezoelectric element 10 explained with reference to FIG. 3B, the driven body 72 driven in the $H_R$ direction in FIG. 3A is driven in the opposite $H_L$ direction. As shown in FIG. 3B, charges are applied between the electrodes 12 and 14 and the common electrodes 15 shown in FIGS. 2A to 2C and charges are not applied to the electrodes 11 and 13, whereby longitudinal vibration indicated by arrows is excited in regions corresponding to the electrodes 12 and 14 in the piezoelectric element 10. However, since charges are not applied to the electrodes 11 and 13, longitudinal vibration is not excited in the electrodes 11 and 13. As a result, bending vibration is caused in the piezoelectric element 10 by the longitudinal vibration of the electrodes 12 and 14 and the non-vibration of the electrodes 11 and 13. The piezoelectric element 10 vibrates as indicated by a piezoelectric element 10B. The longitudinal vibration and the bending vibration by the longitudinal vibration occur in the piezoelectric element 10. The protrusion section 10a swings in an arrow direction of an elliptical track $Q_L$ shown in the figure. The swing in the $Q_L$ direction on the elliptical track of the protrusion section 10a drives the driven body 72, which is brought into contact with the protrusion section 10a, as indicated by $H_L$ shown in the figure.

The applicator of charges to the electrodes 11, 12, 13, and 14 is switched as explained above. Consequently, it is possible to change the direction of the bending vibration of the piezoelectric element 10 and easily switch the driving direction of the driven body 72. Nodes of vibration in two vibration modes of the bending vibration and the longitudinal vibration of the piezoelectric element 10 are explained with reference to FIG. 3C. FIG. 3C is a conceptual diagram of the vibration modes of the piezoelectric element 10. As shown in FIG. 3C, the piezoelectric element 10 changes to the vibration states indicated by the piezoelectric elements 10A and 10B according to a bending vibration mode of the vibration state explained with reference to FIGS. 3A and 3B. At this point, a line L, which is the center line in the piezoelectric element 10 according to this embodiment, along a vibrating direction in a longitudinal vibration mode of the piezoelectric element 10 in a vibration stop state is a bent track as indicated by a line LA in the piezoelectric element 10A in the vibration state and a line LB in the piezoelectric element 10B. Positions where the line LA and the line LB corresponding to the bending vibration mode and the line L corresponding to the longitudinal vibration mode cross each other are called nodes of vibration P1, P2, and P3 (hereinafter referred to as nodes P1, P2, and P3).

Figure 4A:
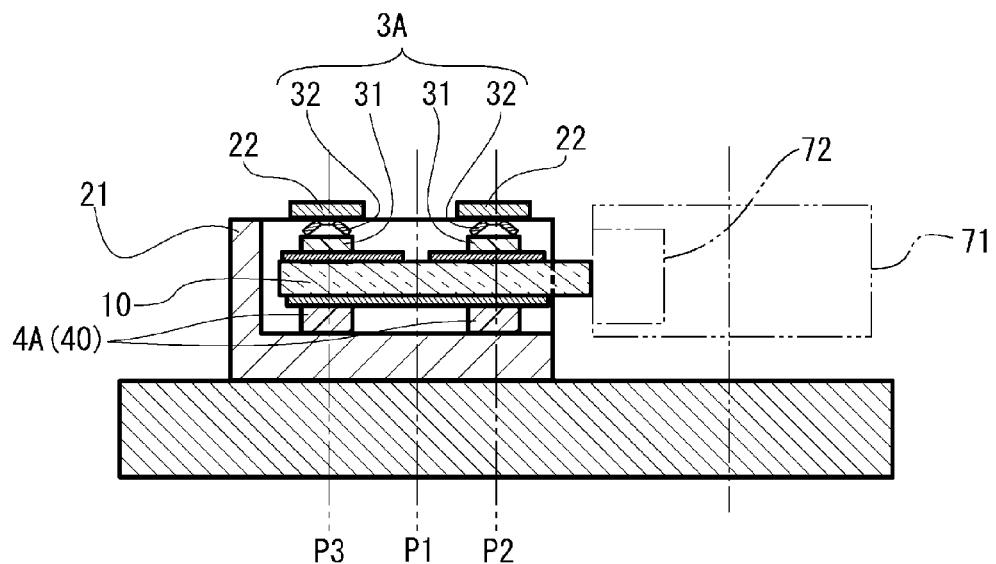
FIGS. 4A and 4B are sectional views showing other forms of the actuator according to the first embodiment.
Figure 4B:
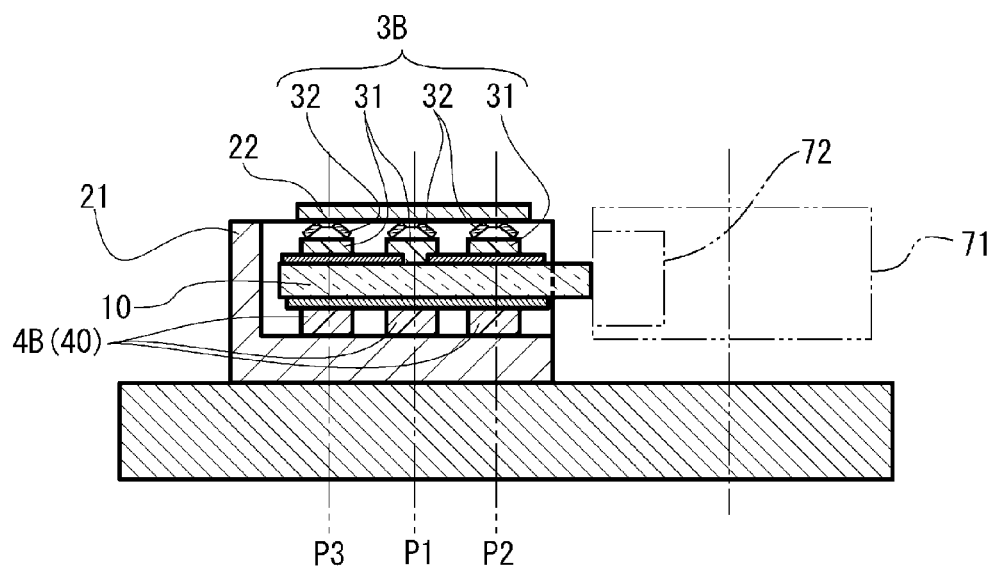

The nodes P1, P2, and P3 are positions where movement in the vibrating surface is small, i.e., amplitude is small in the vibration of the piezoelectric element 10. Therefore, the first supporting section 30 and the second supporting section 40 that support the piezoelectric element 10 included in the actuator 100 according to this embodiment are arranged to support a region including the node P1. A position supported by the first supporting section 30 and the second supporting section 40 is not limited to this. For example, as shown in FIG. 4A, which is a sectional view in an A-A' direction shown in FIG. 1A, the first supporting section 30 and the second supporting section 40 may support two places of the nodes P2 and P3 as indicated by a first supporting section 3A and a second supporting section 4A. Alternatively, as shown in FIG. 4B, the first supporting section 30 and the second supporting section 40 may support three places of the nodes P1, P2, and P3 as indicated by a first supporting section 3B and a second supporting section 4B.

Figure 5A:
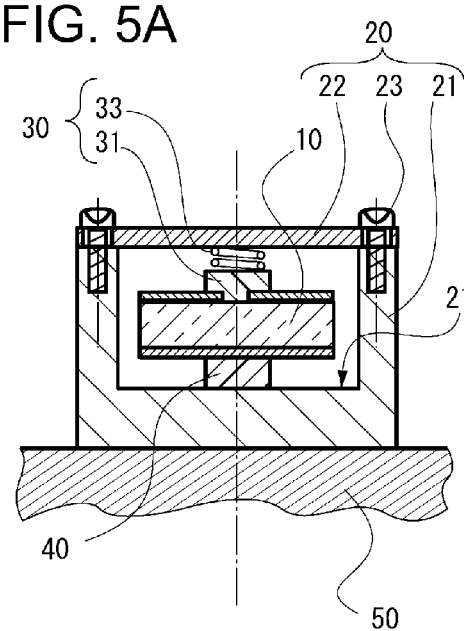
FIGS. 5A to 5D are sectional views showing other forms of the actuator according to the first embodiment.
Figure 5B:
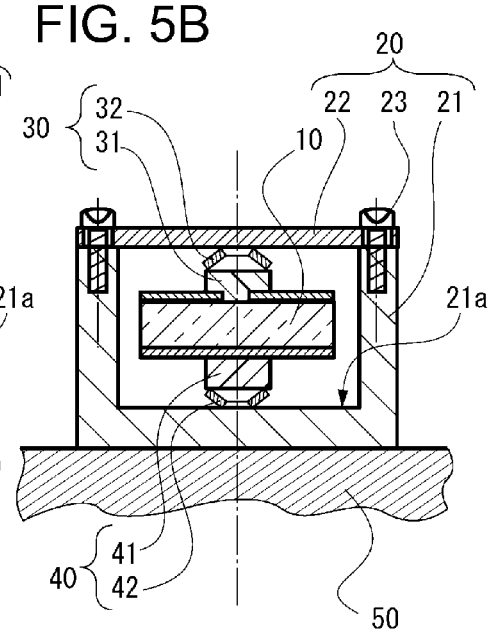

FIGS. 5A and 5B show other forms of the first supporting section 30 and the second supporting section 40. FIGS. 5A and 5B are sectional views corresponding to a B-B' section shown in FIG. 1A. In the first supporting section 30 shown in FIG. 5A, a coil spring 33 is arranged as an elastic member. Since the coil spring 33 is arranged, it is easy to adjust a holding force for the piezoelectric element 10 via the cushioning member 31 and the second supporting section 40 formed of the cushioning material. It is possible to maintain a stable elastic force for a long period and obtain stable vibration of the piezoelectric element 10. In both of the first supporting section 30 and the second supporting section 40 shown in FIG. 5B, disc springs 32 and 42 are arranged as elastic members. Cushioning members 31 and 41 are arranged between the disc springs 32 and 42 and the piezoelectric element 10. The disc springs 32 and 42 are arranged in the supporting sections 30 and 40 in this way. Consequently, it is possible to arrange a pressing force applied to the piezoelectric element 10 via the cushioning members 31 and 41 in a well-balanced state.

Figure 5C:
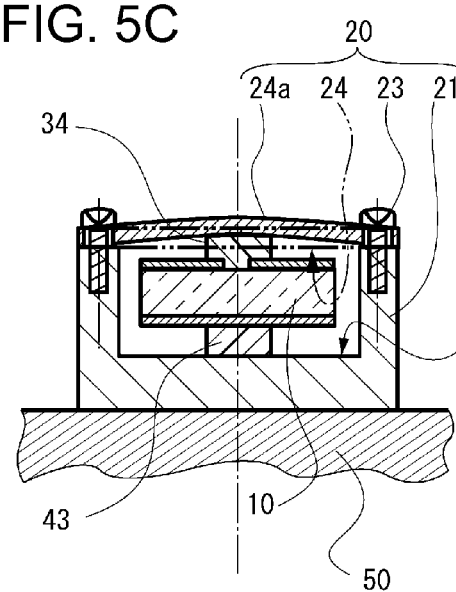

Both of a first supporting section 34 and a second supporting section 43 shown in FIG. 5C are formed of a cushioning material. When the first supporting section 34, the piezoelectric element 10, and the second supporting section 43 are held between a pressing plate 24 and the supporting surface 21a of the case body 21, the pressing plate 24 is bent as indicated by a pressing plate 24a shown in the figure. The pressing plate 24 is formed as an elastic member by the stress of the bending. With such a configuration, the disc springs 32, 33, and 42 and the coil spring 33 functioning as the elastic members are unnecessary. Therefore, it is possible to obtain the actuator 100 at low costs.

Figure 5D:
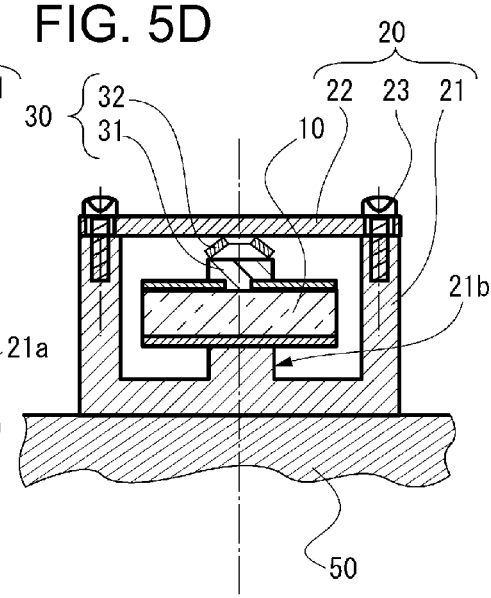

In the first supporting section 30 shown in FIG. 5D, the disc spring 32 is arranged and the cushioning member 31 is arranged between the disc spring 32 and the piezoelectric element 10. However, the second supporting section 40 of the actuator 100 shown in FIGS. 1A to 1C is not arranged. A protrusion section 21b formed in the case body 21 can be used as a second supporting section. With such a configuration, it is possible to obtain the actuator 100 at lower costs.

The actuator 100 according to this embodiment includes the first supporting section 30 and the second supporting section 40, which include the cushioning material, to hold the piezoelectric element 10 in a direction crossing the vibrating surface. Therefore, it is possible to suppress the vibration of the piezoelectric element 10 from leaking to the holding case 20. Consequently, it is possible to generate a swing of the protrusion section 10a without wasting the vibration of the piezoelectric element 10 and convert the swing into the rotation or the linear motion of the driven body 71 or 72 that comes into contact with the protrusion section 10a. In other words, it is possible to obtain an actuator having high driving efficiency. Further, the supporting sections 30 and 40 are provided in the region including the nodes of the vibration of the piezoelectric element 10. Since the region is a region with a small moving amount due to the vibration of the piezoelectric element 10, i.e., a region with small amplitude, it is possible to suppress the vibration leak to the holding case 20.

Further, the disc spring 32, the coil spring 33, or the pressing plate 24 functioning as the elastic member is arranged in at least one of the first supporting section 30 and the second supporting section 40. The cushioning member and the supporting sections 34 and 43 formed of the cushioning material are pressed in the holding case 20 by bending elasticity of the elastic member. It is possible to suppress, with a friction force between the holding case 20 and the piezoelectric element 10 against a repulsive force of the supporting sections 34 and 43, relative positional deviation due to vibration. A supporting region of the piezoelectric element 10 by the cushioning member 31 and the supporting sections 34 and 43 formed of the cushioning material may be fixed by an adhesive or the like.

Second Embodiment

Figure 6:
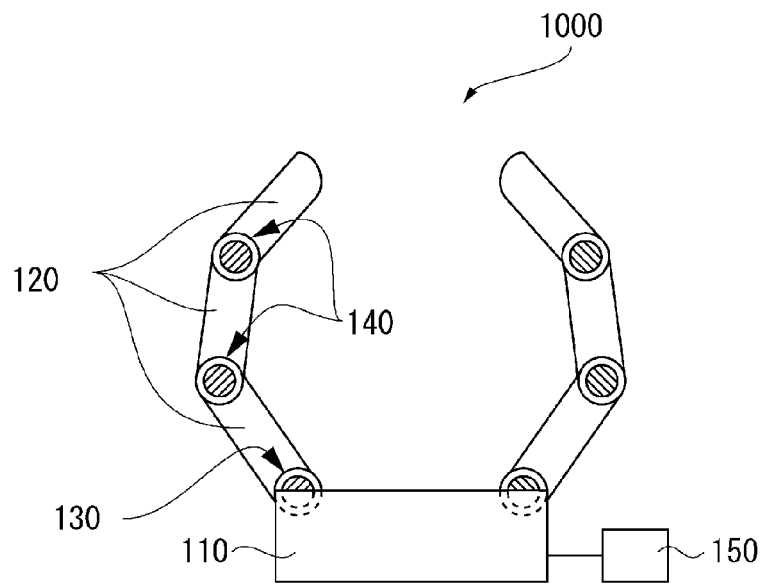
FIG. 6 is an external view showing a robot hand according to a second embodiment.

FIG. 6 is an external view showing a robot hand 1000 including the actuator 100 according to the first embodiment. The actuator 100 included in the robot hand 1000 shown in FIG. 6 is the actuator 100 according to the first embodiment. The actuator 100 includes the driven body 71 driven to rotate (see FIG. 1A). The actuator 100 is used as a rotation driving motor for joint sections of the robot hand 1000 explained below. The robot hand 1000 includes a finger section 120 connected to a base section 110. The actuators 100 functioning as motors are incorporated in a connecting section 130 of the base section 110 and the finger section 120 and joint sections 140 of the finger section 120. The robot hand 1000 includes a control section 150. The robot hand 1000 can pivot the connecting section 130 and the joint sections 140 by driving the actuators 100 with the control section 150 and transform the finger section 120 into a desired form like a finger of a human.

Third Embodiment

Figure 7:
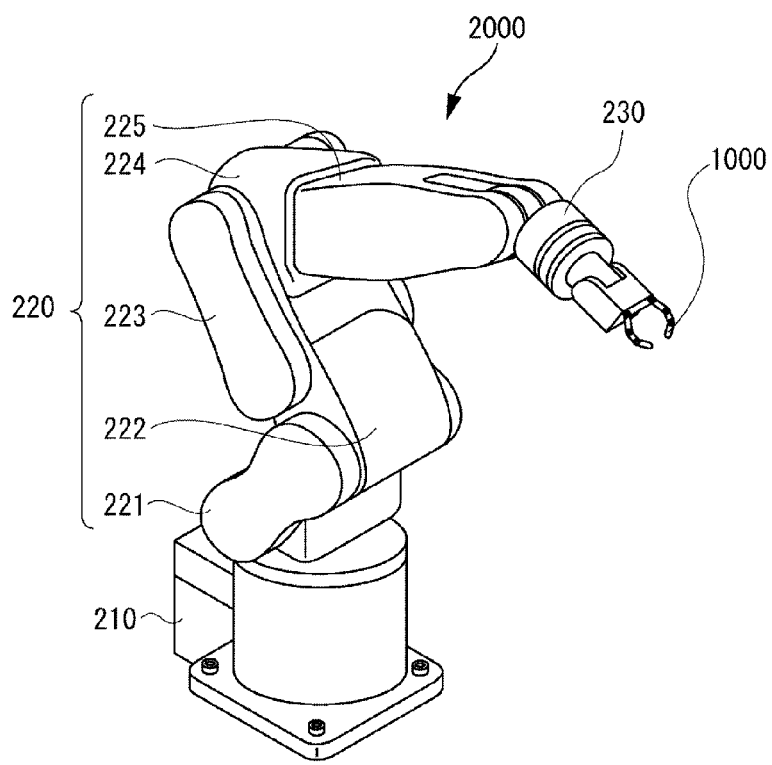
FIG. 7 is an external view showing a robot according to a third embodiment.

FIG. 7 is an external view showing the configuration of a robot 2000 including the robot hand 1000 according to the second embodiment. The robot 2000 includes a main body section 210, an arm section 220, and the robot hand 1000. The robot 2000 shown in the figure is classified as a so-called multi-joint robot. The main body section 210 is fixed on, for example, a floor, a wall, a ceiling, or a movable carriage. The arm section 220 is provided to be movable with respect to the main body section 210. A not-shown actuator that generates power for rotating the arm section 220, a control section that controls the actuator, and the like are incorporated in the main body section 210.

The arm section 220 includes a first frame 221, a second frame 222, a third frame 223, a fourth frame 224, and a fifth frame 225. The first frame 221 is connected to the main body section 210 via a rotating and bending shaft to be capable of rotating or bending. The second frame 222 is connected to the first frame 221 and the third frame 223 via a rotating and bending shaft. The third frame 223 is connected to the second frame 222 and the fourth frame 224 via a rotating and bending shaft. The fourth frame 224 is connected to the third frame 223 and the fifth frame 225 via a rotating and bending shaft. The fifth frame 225 is connected to the fourth frame 224 via a rotating and bending shaft. In the arm section 220, the frames 221 to 225 rotate or bend to move in a compound manner around the rotating and bending shafts according to the control by the control section.

A robot-hand connecting section 230 is connected to a side of the fifth frame 225 of the arm section 220 on the opposite side of a side where the fourth frame 224 is provided. The robot hand 1000 is attached to the robot-hand connecting section 230. The actuator 100 that applies a rotating action to the robot hand 1000 is incorporated in the robot-hand connecting section 230. The robot hand 1000 can grip an object. By using the robot hand 1000 small in size and light in weight, it is possible to provide a robot having high universality and capable of performing assembly work, test, and the like of a complicated electronic apparatus.

Fourth Embodiment

Figure 8:
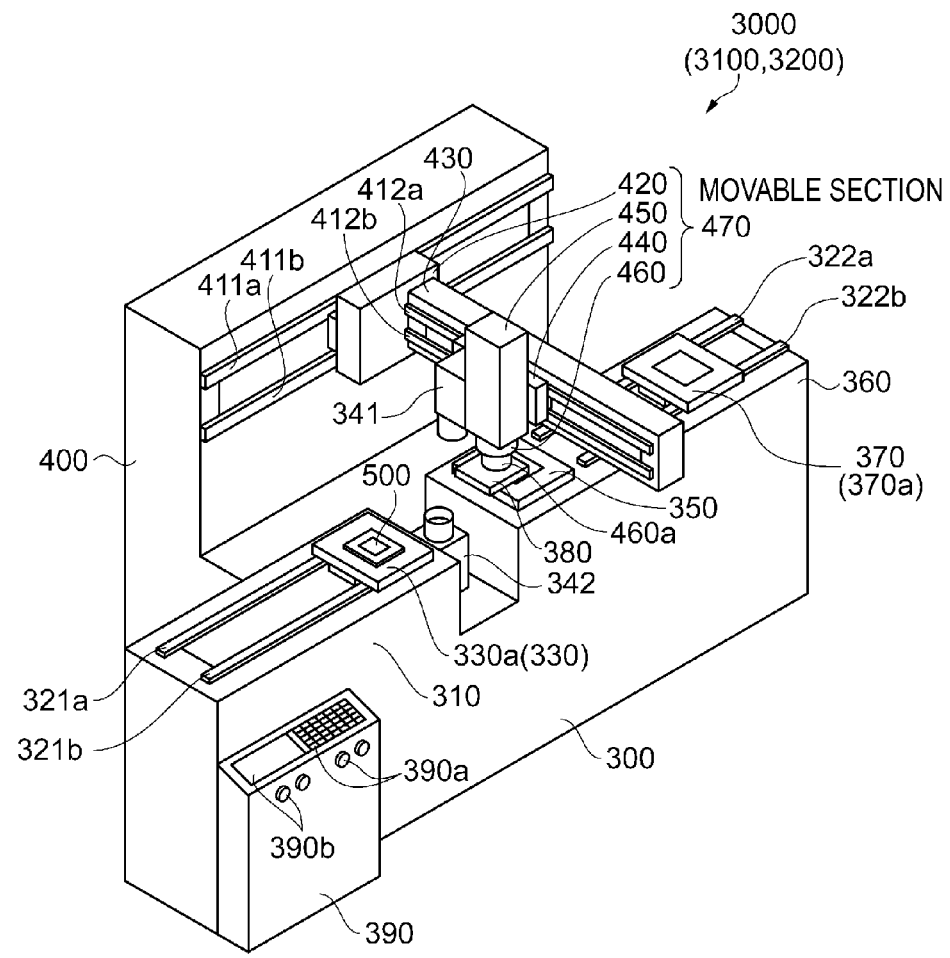
FIG. 8 is an external view showing an electronic component testing apparatus according to a fourth embodiment.

FIG. 8 is an external view showing an electronic component testing apparatus including an electronic component conveying robot, which is an embodiment of a Cartesian coordinate robot, including the actuator 100 according to the first embodiment. An electronic component testing apparatus 3000 (hereinafter referred to as testing apparatus 3000) shown in FIG. 8 includes a section 3100 having a function of testing electrical characteristics of an electronic component (hereinafter referred to as testing section 3100) and a conveying device section 3200 functioning as an electronic component conveying robot that conveys the electronic component between predetermined positions (hereinafter referred to as conveying device section 3200).

The testing apparatus 3000 shown in FIG. 8 includes a rectangular parallelepiped apparatus base 300. The longitudinal direction of the apparatus base 300 is represented as Y direction and a direction orthogonal to the Y direction on the horizontal plane is represented as X direction. The vertical direction is represented as Z(−) direction.

On the apparatus base 300, a material supplying device 310 is set on the left side in the figure. On the upper surface of the material supplying device 310, a pair of guide rails 321a and 321b extending in the Y direction are protrudingly provided over the entire width in the Y direction of the material supplying device 310. A stage 330 including a direct-acting mechanism is attached to the upper side of the pair of guide rails 321a and 321b. The direct-acting mechanism of the stage 330 is, for example, a direct-acting mechanism including a linear motor extending in the Y direction along the guide rails 321a and 321b. When a driving signal corresponding to a predetermined number of steps is input to the linear motor of the direct-acting mechanism, the linear motor advances or recedes. The stage 330 moves forward or backward along the Y direction by a distance equivalent to the number of steps. A surface of the stage 330 facing the Z direction is a placing surface 330a. An electronic component 500 is placed on the placing surface 330a. A substrate chuck mechanism of an attraction type is set on the stage 330. The substrate chuck mechanism fixes the electronic component 500 to the placing surface 330a.

On the apparatus base 300, a second image pickup section 342 functioning as an image pickup section is set on the Y direction side of the material supplying device 310. The second image pickup section 342 includes an electric circuit substrate mounted with, for example, a CCD (Charge Coupled Device) that converts received light into an electric signal, an objective lens including a zoom function, an epi-illumination device, and an automatic focusing mechanism. Consequently, when the electronic component 500 is located in a place opposed to the second image pickup section 342, the second image pickup section 342 can photograph the electronic component 500. The second image pickup section 342 can pick up a focused image by photographing the electronic component 500 after irradiating light and focusing on the electronic component 500.

A test table 350 is set on the Y direction side of the second image pickup section 342 in the apparatus base 300. The test table 350 is a jig for transmitting and receiving an electric signal when the electronic component 500 is tested.

On the apparatus base 300, a material removing device 360 is set on the Y direction side of the test table 350. On the upper surface of the material removing device 360, a pair of guide rails 322a and 322b extending in the Y direction are protrudingly provided over the entire width. A stage 370 including a direct-acting mechanism is attached to the upper side of the pair of guide rails 322a and 322b. As the direct-acting mechanism of the stage 370, a mechanism same as the direct-acting mechanism included in the material supplying device 310 can be used. The stage 370 moves forward or backward along the guide rails 322a and 322b. A surface of the stage 370 facing the Z direction is a placing surface 370a. The electronic component 500 is placed on the placing surface 370a.

A substantially rectangular parallelepiped supporting table 400 is set in an X(−) direction of the apparatus base 300. The supporting table 400 has a shape high in a Z(+) direction compared with the apparatus base 300. On a surface of the supporting table 400 facing the X direction, a pair of driving rails 411a and 411b functioning as driven bodies extending in the Y direction are protrudingly provided over the entire width in the Y direction of the supporting table 400. On the X direction side of the driving rails 411a and 411b, a Y stage 420 including a direct-acting mechanism that moves along the pair of driving rails 411a and 411b is attached. At least one of the driving rail 411a and the driving rail 411b is the driven body 72 (see FIGS. 1A to 1C) of the actuator 100 according to the first embodiment. The piezoelectric element 10 that is brought into contact with one or both of the driving rail 411a and the driving rail 411b is included in the direct-acting mechanism of the Y stage 420. The piezoelectric element 10 included in the Y stage 420 is vibrated, whereby the Y stage 420 moves forward or backward along the driving rails 411a and 411b relatively to the fixed driving rails 411a and 411b.

On a surface of the Y stage facing the X direction, a square pillar-like arm section 430 extending in the X direction is set. On a surface of the arm section 430 facing the −Y direction, a pair of driving rails 412a and 412b extending in the X direction are protrudingly provided over the entire width in the X direction of the arm section 430. An X stage 440 including a direct-acting mechanism that moves along the driving rails 412a and 412b is attached to the −Y direction side of the pair of driving rails 412a and 412b. At least one of the driving rail 412a and the driving rail 412b is the driven body 72 (see FIGS. 1A to 1C) of the actuator 100 according to the first embodiment. The piezoelectric element 10 that is brought into contact with one or both of the driving rail 412a and the driving rail 412b is included in the direct-acting mechanism of the X stage 440. The piezoelectric element 10 included in the X stage 440 is vibrated, whereby the X stage 440 moves forward or backward along the driving rails 412a and 412b relatively to the fixed driving rails 412a and 412b.

On the X stage 440, a first image pickup section 341 functioning as an image pickup section and a Z moving device 450 are set. The first image pickup section 341 has a structure and a function same as those of the second image pickup section 342. The first image pickup section 341 and the second pickup section 342 form an image pickup section. The Z moving device 450 includes a direct-acting mechanism on the inside and the direct-acting mechanism lifts and lowers a Z stage. A rotating device 460 is connected to the Z stage. The Z moving device 450 can lift and lower the rotating device 460 in the Z direction. The direct-acting mechanism of the Z moving device 450 can include the Y stage 420 driven along the driving rails 411a and 411b, the X stage 440 driven along the driving rails 412a and 412b, and the actuator 100 according to the first embodiment.

The rotating device 460 includes a rotating shaft 460a. A gripping section 380 is connected to the rotating shaft 460a. Consequently, the rotating device 460 can rotate the gripping section 380 with an axis set in the Z direction. As the rotating device 460, a rotation driving mechanism including the driven body 71 (see FIGS. 1A to 1C) in the actuator 100 according to the first embodiment is used in this embodiment. The rotating device 460 is combined with a decelerating device. The rotating device 460 pivots the rotating shaft 460a to a predetermined angle. As the rotating mechanism, a step motor or a servo motor can be used. When the servo motor is used, a type of the motor is not specifically limited. An AC motor, a DC motor, a coreless motor, an ultrasonic motor, and the like can be used. The Y stage 420, the X stage 440, the Z moving device 450, the rotating device 460, and the like form a movable section 470.

A control device 390 functioning as a control section is set on the X direction side of the apparatus base 300. The control device 390 has a function of controlling the operation of the test apparatus 3000. Further, the control device 390 has a function of testing the electronic component 500. The control device 390 includes an input device 390a and an output device 390b. The input device 390a is a keyboard, an input connector, or the like and is a device for inputting an instruction of an operator besides signals and data. The output device 390b is an output connector or the like for output to a display device and an external device. The output device 390b outputs signals and data to other devices. Further, the output device 390b is a device that transmits a state of the test apparatus 3000 to the operator.

In the configuration explained above, the main components of the testing section 3100 are the apparatus base 300, the material supplying device 310, the stage 330, the first image pickup section 341, the second image pickup section 342, the test table 350, the material removing device 360, the stage 370, and the like. The testing section 3100 performs removal and supply of the test target electronic component 500, image processing, electrical characteristic measurement, and the like. The main components of the conveying device section 3200 are the supporting table 400, the driving rails 411a and 411b, the Y stage 420, the arm section 430, the driving rails 412a and 412b, the X stage 440, the Z moving device 450, and the rotating device 460. The conveying device section 3200 conveys the electronic component 500 from the material supplying device 310 to the test table 350 and the material removing device 360.

In general, the electronic component 500 tested by the testing apparatus 3000 is set under a clean environment, i.e., a dust-proof environment. Although not shown in the figure, a plurality of probes for measuring electrical characteristics of the electronic component 500 are arranged on the test table 350. The electronic component 500 has to be conveyed from the material supplying device 310 to the test table 350 such that positions of the electronic component 500 with which the probes should come into contact are accurately arranged for all the probes. Before the electronic component 500 is placed on the test table 350, the position of the electronic component 500 is subjected to image processing from an image of the electronic component 500 obtained by the first image pickup section 341 and the second image pickup section 342. The position of the electronic component 500 is accurately aligned by the conveying device 3200 in the positions of the probes included in the test table 350. The electronic component 500 is placed on the test table 350.

Further, the electronic component 500 is becoming more small and precise and having a larger number of functions. Therefore, in general, so-called total inspection is performed. Therefore, since the number of electronic components 500 that should be tested is extremely large, a series of test of the electronic components 500 is required to enable test processing in a shorter time. In particular, a conveyance time for the electronic components 500 in an inspection time is required to be reduced. Therefore, the Y stage 420, the X stage 440, and the Z moving device 450 including the actuator 100 according to the first embodiment are included in the testing apparatus 3000. Consequently, it is possible to control an acceleration time to predetermined moving speed and a deceleration time to stop to be short. It is possible to obtain an electronic component testing apparatus having a short test time. The electronic component testing apparatus can be applied as an electronic component testing apparatus that tests, for example, a semiconductor, a display device such as an LCD, a quartz device, various sensor devices, an inkjet head, and various MEMS devices as the electronic components 500.

Fifth Embodiment

Figure 9A:
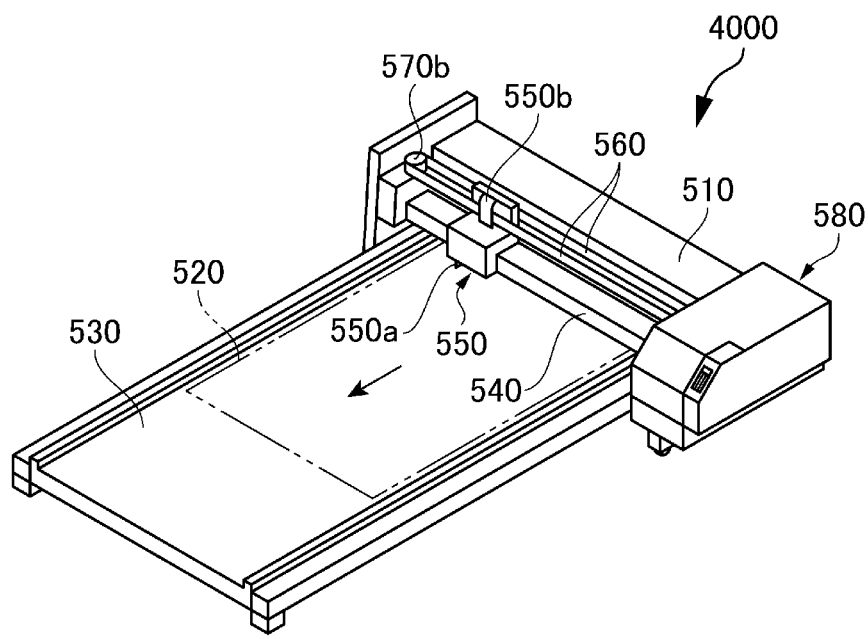
FIG. 9A is a perspective view of a printer according to a fifth embodiment.
Figure 9B:
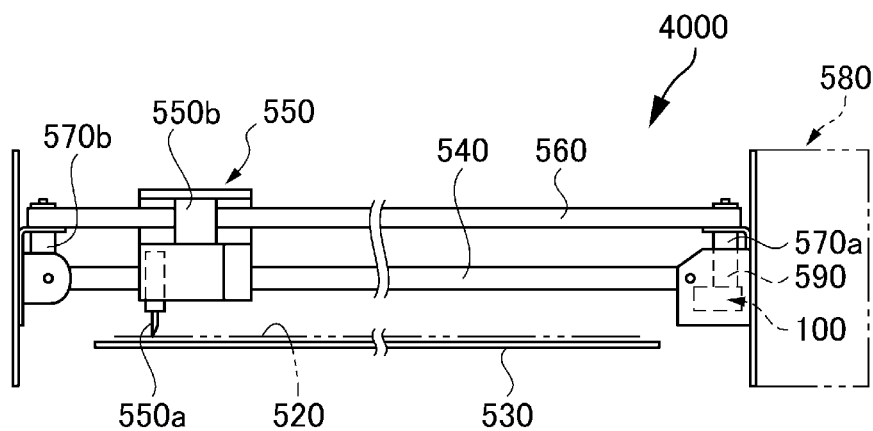
FIG. 9B is a plan view of a cutting head included in the printer shown in FIG. 9A.

FIGS. 9A and 9B show a printer according to a fifth embodiment. FIG. 9A is a perspective view showing the printer and FIG. 9B is a plan view showing a cutting head included in the printer shown in FIG. 9A.

As shown in FIG. 9A, a printer 4000 includes a printing section 510 for printing on a print sheet 520, a platen 530 functioning as a stage configured to hold the print sheet 520 between the platen and the printing section 510 and guide the print sheet 520, a cutting head 550 for cutting the printed print sheet 520, and a control section 580 configured to control the printer 4000. The cutting head 550 is a type for cutting the print sheet 520 in a direction orthogonal to a direction in which the print sheet 520 is conveyed. The cutting head 550 includes a cutter 550a for cutting the print sheet 520.

A mechanism for cutting the print sheet 520 includes, as shown in FIG. 9B, a guide rail 540 configured to support the cutting head 550 and guide movement of the cutting head 550, a ring-like belt 560 configured to move the cutting head 550 along the guide rail 540, a belt coupling section 550b for coupling the cutting head 550 to the ring-like belt 560, and a driving shaft 570a and a driven shaft 570b provided on a start end side and a terminal end side of the movement of the cutting head 550 in order to drive the ring-like belt 560.

The driving shaft 570a is rotated by the actuator 100 to drive the ring-like belt 560. The rotation of the rotating shaft of the actuator 100 is transmitted to the driving shaft 570a via a speed increasing gear 590. In the printer 4000 having such a configuration, the driving shaft 570a rotates when the actuator 100 is driven, the ring-like belt 560 rotates between the driving shaft 570a and the driven shaft 570b according to the rotation of the driving shaft 570a, and the cutting head 550 coupled to the rotating ring-like belt 560 moves along the guide rail 540. Consequently, the cutter 550a of the cutting head 550 cuts the print sheet 520.

In the printer 4000, since the actuator 100 is used for the driving of the driving shaft 570a, the vicinity of the driving shaft 570a can be formed compact. Therefore, the printer 4000 can be reduced in size and has high durability.

The entire disclosure of Japanese Patent Application No. 2011-266550, filed Dec. 6, 2011 is expressly incorporated by reference herein.

What is claimed is:

1. An actuator comprising:
   a piezoelectric element excited to vibrate in a longitudinal vibration mode and a bending vibration mode;
   a driven body with which a contact section included in the piezoelectric element comes into contact, the driven body being driven by vibration of the contact section;
   a holding section configured to hold the piezoelectric element; and
   a base including an urging section configured to urge the holding section to the driven body, wherein
   the holding section includes a first supporting section arranged in a direction crossing a vibrating surface of the piezoelectric element and arranged on one side of the piezoelectric element and a second supporting section arranged on the other side to be opposed to the first supporting section via the piezoelectric element.

2. The actuator according to claim 1, wherein a supported region of the piezoelectric element supported by the first supporting section and the second supporting section includes at least one of nodes of vibration, which are nodes of vibration in the longitudinal vibration mode of the piezoelectric element and nodes of vibration in the bending vibration mode of the piezoelectric element.

3. The actuator according to claim 1, wherein at least one of the first supporting section and the second supporting section includes a cushioning section.

4. The actuator according to claim 1, wherein at least one of the first supporting section and the second supporting section includes an elastic section.

* * * * *